United States Patent
Marques et al.

(10) Patent No.: US 7,230,504 B1
(45) Date of Patent: Jun. 12, 2007

(54) CONTROLLED OSCILLATOR

(75) Inventors: Augusto M. Marques, Austin, TX (US); Scott D. Willingham, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 43 days.

(21) Appl. No.: 11/216,496

(22) Filed: Aug. 31, 2005

(51) Int. Cl.
*H03B 5/00* (2006.01)

(52) U.S. Cl. ............... 331/117 FE; 331/175; 331/117 R; 331/167; 331/177 V; 331/36 C

(58) Field of Classification Search .......... 331/117 FE, 331/117 R, 177 V, 175, 167, 36 C
See application file for complete search history.

(56) References Cited

U.S. PATENT DOCUMENTS

| | | |
|---|---|---|
| 6,037,842 A | 3/2000 | Bryan |
| 6,060,956 A | 5/2000 | Yuen et al. |
| 6,140,884 A | 10/2000 | Harpham |
| 6,268,778 B1 | 7/2001 | Mucke |
| 6,661,301 B2 * | 12/2003 | Traub ...................... 331/117 R |
| 7,084,713 B2 * | 8/2006 | Peluso ........................ 331/179 |
| 2002/0033739 A1 | 3/2002 | Bisanti |

* cited by examiner

Primary Examiner—Arnold Kinkead
(74) Attorney, Agent, or Firm—Meyertons Hood Kivlin Kowert & Goetzel, P.C.; B. Noël Kivlin; Stephen J. Curran

(57) ABSTRACT

A controlled oscillator circuit includes an amplifier including a first transistor coupled between a first node and a reference node, and a second transistor coupled between a second node and the reference node. The gate of first transistor and the gate of the second transistor may be cross-coupled. The oscillator may also include one or more variable capacitance circuits coupled between the first node and the second node, each including a first capacitor coupled between the first node and a third node, and a second capacitor coupled between the second node and a fourth node. Each variable capacitance circuit may also include a third, a fourth and a fifth transistor interconnected to selectively couple the first and second capacitors to the reference node. The third, fourth and fifth transistors may be low voltage transistors and the first and the second transistors may be high voltage transistors.

28 Claims, 5 Drawing Sheets

CONTROLLED OSCILLATOR

BACKGROUND OF THE INVENTION

1. Field of the Invention

This invention relates to semiconductor integrated circuits and, more particularly, to the topology and structure of oscillators manufactured on semiconductor integrated circuits.

2. Description of the Related Art

Many wireless communication devices such as mobile telephones, for example, employ a number of integrated circuits (ICs) to perform various functions. One such function is the generation of high frequency signals for use during transmission and reception. As such, some communication devices may include one or more frequency synthesizer circuits such as a phase locked loop (PLL), for example, to generate the desired high frequency signals.

A frequency synthesizer typically includes a controlled oscillator circuit, such as voltage-controlled oscillators (VCO), for example, which may be used within the control loop of a synthesizer. It may be generally desirable to integrate the oscillator circuit with the other components of the frequency synthesizer onto a single IC. However, depending on various factors such as operating frequency and fabrication technology, for example, it may be difficult to implement certain oscillator circuits on an IC.

SUMMARY

Various embodiments of a controlled oscillator are disclosed. In one embodiment, an oscillator circuit includes an amplifier including a first switching transistor coupled between a first node and a reference node, and a second switching transistor coupled between a second node and the reference node. An output of the first switching transistor is coupled to a gate terminal of the second switching transistor and an output of the second switching transistor is coupled to a gate terminal of the first switching transistor. The oscillator may also include one or more variable capacitance circuits coupled between the first node and the second node. Each variable capacitance circuit may include a first capacitor coupled between the first node and a third node, a second capacitor coupled between the second node and a fourth node. In addition, each variable capacitance circuit may include a third, a fourth and a fifth switching transistor interconnected to selectively couple the first and second capacitors to the reference node. The third, fourth and fifth switching transistors may be low voltage transistors and the first and the second switching transistors may be high voltage transistors.

Figure 1:
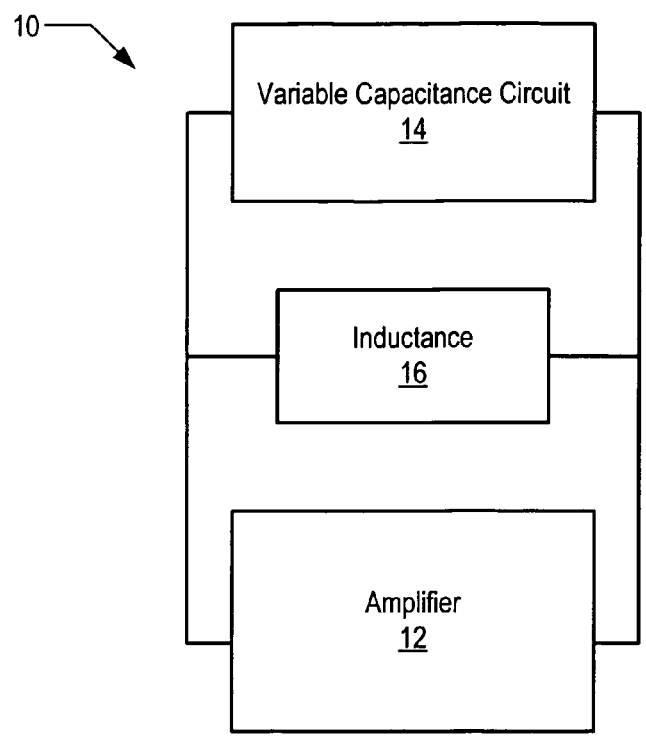
FIG. 1 is a block diagram of one embodiment of a controlled oscillator.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a simplified block diagram of one embodiment of an oscillator is shown. Oscillator 10 includes a variable capacitance circuit 14 coupled to an inductance 16 that is, in turn coupled to amplifier 12. It is noted that one or more portions of oscillator 10 may be manufactured on a semiconductor integrated circuit.

In the illustrated embodiment, oscillator 10 may oscillate at one or more frequencies that may be determined, at least in part, by the combination of inductance and capacitance (i.e., an LC tank) provided by inductance 16 and variable capacitance circuit 14, respectively. Amplifier 12 may provide the amplification necessary to drive and sustain oscillations.

In one embodiment, oscillator 10 is referred to as a controlled oscillator since an output frequency of oscillator 10 may be controlled by both digital and analog means. For example, as will be described in greater detail below, the output frequency of oscillator 10 may be adjusted by providing a digital calibration value to variable capacitance circuit 14. It is noted that in one embodiment, the digital calibration value may be a discrete signal such as a digital word including one or more bits, for example.

Figure 2:
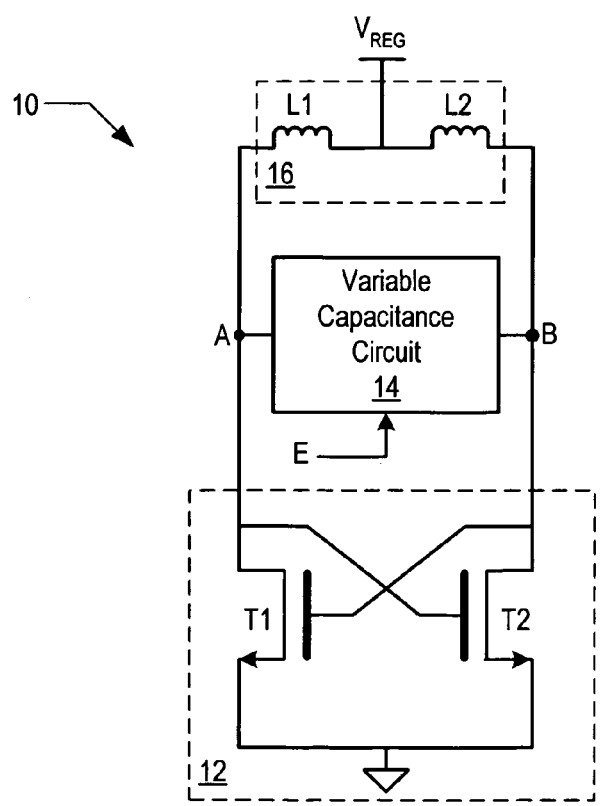
FIG. 2 is a block diagram illustrating more detailed aspects of the embodiment of the controlled oscillator of FIG. 1.

Oscillator 10 of FIG. 2 is similar to oscillator 10 of FIG. 1. However, in FIG. 2, more detailed aspects of inductance 16 and amplifier 12 are shown. In FIG. 2, variable capacitance circuit 14 is coupled between node 'A' and node 'B'. In addition, a control input 'E' is coupled to variable capacitance circuit 14. In one embodiment, input 'E' may be a discrete signal. Inductance 16 includes inductors L1 and L2. One side of inductor L1 is coupled to node 'A' and one side of inductor L2 is coupled to node 'B'. The other side of each inductor is coupled together at a node. The node formed between the two inductors is coupled to a supply voltage, designated $V_{REG}$. It is noted that in one implementation, the inductance value of each of L1 and L2 may be one half of the calculated total inductance necessary for expected operation of the circuit.

In the illustrated embodiment, amplifier 12 includes two switching transistors, designated T1 and T2, which are crossed-coupled to nodes 'A' and 'B'. More particularly, the drain and source of transistor T1 are coupled between node 'A' and circuit ground, and the gate of transistor T1 is coupled to node 'B'. The drain and source of transistor T2 are coupled between node 'B' and circuit ground, and the gate of transistor T2 is coupled to node 'A'. It is noted that in one embodiment, the source of transistors T1 and T2 are coupled to circuit ground.

It is noted that each semiconductor fabrication facility may be capable of one or more fabrication technologies. A given technology may refer to the ability to produce transistors having particular transistor geometries, such as channel length for example. For each technology, many processes may define one or more voltages at which the transistors may operate. For example, a 0.18-micron technology at one fabrication facility may have two transistor operating voltages available. Thus one voltage may be considered a low voltage (LV) such as 1.2 volts, and one voltage may be considered a high voltage (HV) such as 3.3 volts, for example. A HV transistor may have thicker gate oxides and longer gate lengths, which may result in lower electric field in the channel region.

Generally speaking, in many integrated circuit designs, a large majority of the transistors in the design may be LV transistors since the LV transistors may consume less power and may switch faster, and therefore be operated at higher frequencies. Thus the LV transistors may be the transistor of choice for a given technology. The HV transistors may typically be used in special applications such as input/output pads, for example. Accordingly, when referring to a transistor as being either a high or low voltage transistor, it may be referenced against what is considered to be the voltage used for the typical transistors in that technology.

The phase noise ($Ph_N$) of oscillator circuit 10 may, at moderate frequency offsets (e.g 200 kHz to 10 MHz), be expressed as $$Ph_N(\Delta\omega) = \frac{kT}{A_0^2}(1+F)(\delta_L + \delta_C)L\left(\frac{\omega_0}{\Delta\omega}\right)^2 \quad (1)$$

where $Ph_N$ is expressed in power in a 1 Hz bandwidth, offset by $\Delta\omega$ from the carrier frequency $\omega_0$, divided by the power of the entire carrier signal which has amplitude $A_0$. Other factors in equation (1) are Boltzmann's constant (k), absolute temperature (T), and inductance (L). The dimensionless factors (F), $\delta_L$, and $\delta_C$ quantify amplifier, inductor, and capacitor qualities, respectively.

Some conventional oscillator circuits may use LV transistors in the amplifier circuit, which may limit the peak-to-peak output voltage amplitude to be approximately 1.2V. Since the phase noise of the oscillator is directly proportional to the inductance of the inductor, and inversely proportional to the peak amplitude of the output voltage, increasing the amplitude of the output signal represents a quadratic decrease in the phase noise of the oscillator. In practical terms, this translates to being able to increase the size of the circuit inductor by the quadratic term without increasing the phase noise. The ability to increase the inductor size is desirable when, at high frequencies, the required inductor size would otherwise be impractically small. It is noted that the size of the inductor as used herein refers primarily to the inductance, but as the inductance increases, the physical size of the inductor may increase as well.

However, an increase in the output voltage may cause unacceptable stresses on LV amplifier transistors. More particularly, the field strengths generated by the elevated output voltage may overstress LV transistors and may cause reliability issues such as premature breakdown.

In the illustrated embodiment, transistors T1 and T2 are drawn such that respective gates are shown as thicker lines. The thicker lines are indicative of transistors T1 and T2 being HV transistors. Specifically, as described above, transistors T1 and T2 may each have attributes that make them HV transistors, which may make them less susceptible than LV transistors to stresses caused by elevated voltages to which they may be exposed.

In one embodiment, oscillator 10 may be operated at $V_{REG}$=1.9 volts. In one implementation, one optimum output voltage swing may be nearly twice $V_{REG}$. As such, the peak-to-peak output voltage of the oscillator may be nearly 3.6V. Increasing the amplitude of the output signal by almost three represents nearly a nine-fold decrease in the phase noise of the oscillator. Thus, given a target phase noise value, if the amplitude of the signal is increased, the inductance of the inductor may be increased. Consequently, in the example above, a nine-fold increase in the size of the inductor may be attainable. Therefore, as described above, using HV transistors in lieu of LV transistors may allow the output voltage amplitude to be increased without overstressing the transistors. It is noted that $V_{REG}$ may be a voltage-regulated version of the chip supply voltage (e.g., VDD). For example, in one embodiment, VDD may be 2.7V and $V_{REG}$ may be 1.9V.

The characteristic impedance of the LC tank circuit may be expressed as $$Z_T = \sqrt{\frac{L}{C}} \quad (2)$$

Accordingly, an increase in the size and inductance of the inductor may possibly improve the circuit's current consumption. This may be a desirable attribute, particularly when used in battery-powered applications such as a mobile telephone, for example.

Figure 3:
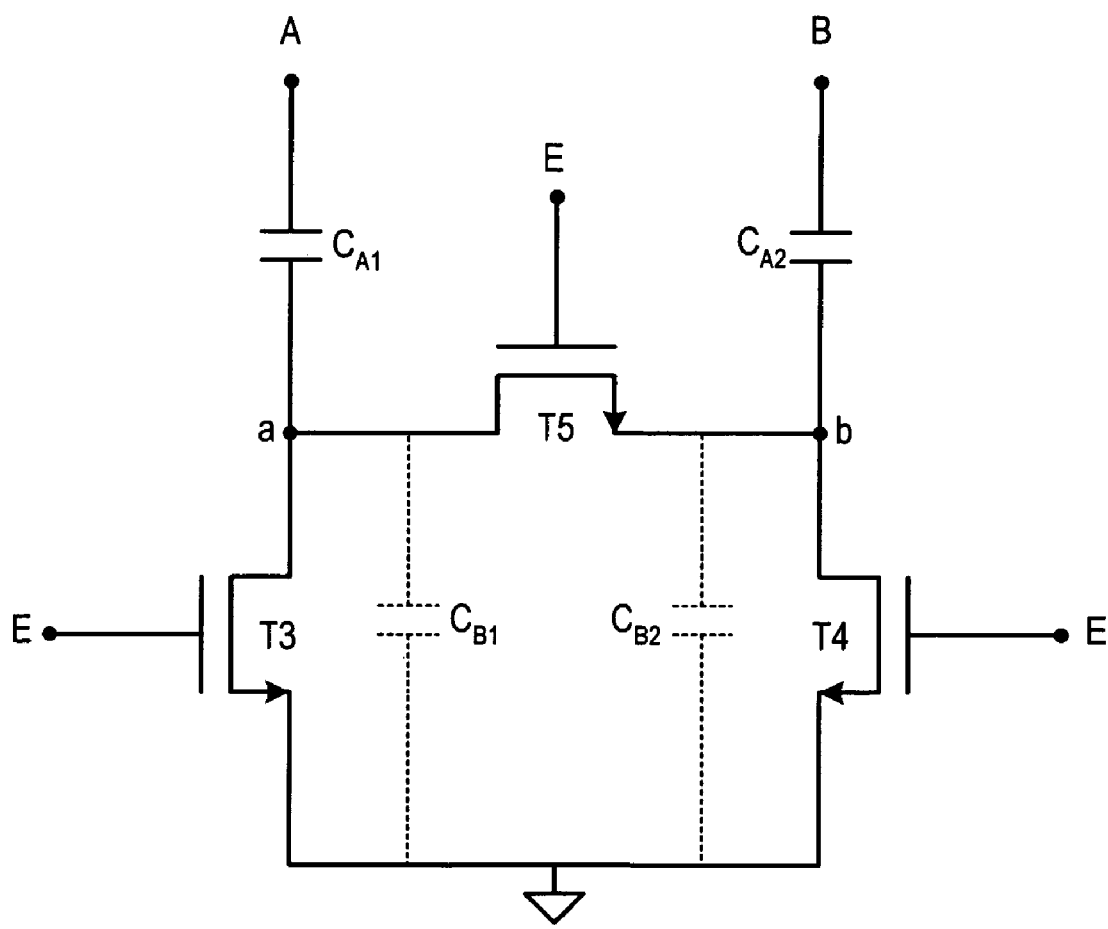
FIG. 3 is a schematic diagram of one embodiment of the variable capacitance circuit shown in FIG. 1 and FIG. 2.

Turning to FIG. 3, a schematic diagram of one embodiment of the variable capacitance circuit 14 is shown. Variable capacitance circuit 14 includes a capacitor $C_{A1}$ and a capacitor $C_{A2}$, and three switching transistors, designated T3, T4 and T5. In addition, as shown, variable capacitance circuit 14 includes parasitic capacitors $C_{B1}$ and $C_{B2}$. Capacitor $C_{A1}$ is coupled between node 'A' and node 'a' while capacitor $C_{A2}$ is coupled between node 'B' and node 'b'. In addition, the drain and source of transistor T3 are coupled between node 'a' and a reference node (e.g., circuit ground), respectively, while the drain and source of transistor T4 are coupled between node 'b' and the reference node, respectively. Further, the drain and source of transistor T5 are coupled between node 'a' and node 'b'. It is noted that capacitor $C_{A1}$ and capacitor $C_{A2}$ may have relatively closely matched capacitance values.

In one embodiment, since transistor T5 may be a series connection between capacitors $C_{A1}$ and $C_{A2}$ when conducting, it may be desirable to manufacture transistor T5 to have a low series resistance. Thus, transistor T5 may be physically larger (e.g., a wider gate) than transistors T3 and T4. Since transistor T5 is large compared to transistors T3 and T4, parasitic diodes between the drain and source of transistor T5 and the substrate may not be negligible. Thus, a parasitic capacitance associated with the diodes is shown as $C_{B1}$ and $C_{B2}$. It is noted that capacitor $C_{B1}$ and capacitor $C_{B2}$ may have relatively closely matched parasitic capacitance values.

As shown, the gates of transistors T3, T4, and T5 are coupled to an input designated 'E'. As mentioned above, a digital calibration value including one or more control bits may be used to change the operating frequency of oscillator 10. In one embodiment, input 'E' may be one control bit of the digital calibration value.

In the illustrated embodiment, transistors T3, T4, and T5 are n-type metal oxide semiconductor (NMOS) transistors. As such, when input 'E' is at a logic value of one, transistors T3, T4, and T5 are in a conductive state. However, it is noted that in another embodiment, transistors T3, T4, and T5 may be implemented as p-type metal oxide semiconductor (PMOS) transistors. In such an embodiment, when input 'E' is at a logic value of zero transistors T3, T4, and T5 enter a conductive state.

As shown, during operation, when transistors T3, T4, and T5 are conducting (on), nodes 'a' and 'b' are connected to the reference node an thus may be at circuit ground potential. The capacitance CAB seen from nodes 'A' and 'B' is $C_{A1}$ in series with $C_{A2}$ connected in series through transistor T5. Since $C_{A1}$ is to a close approximation equal to $C_{A2}$, this capacitance may written as $$C_{AB1} = C_{max} = \frac{C_A}{2} \quad (3)$$

However, when transistors T3, T4, and T5 are not conducting (off), the capacitance $C_{AB2}$ seen from nodes 'A' and 'B' is $C_{A1}$ in series with $C_{B1}$ in series with $C_{A2}$ in series with $C_{B2}$. Since $C_{B1}$ is to a close approximation equal to $C_{B2}$, this capacitance may be written as $$C_{AB2} = C_{min} = \frac{C_A C_B}{2(C_A + C_B)} \quad (4)$$

As such, since the parasitic capacitances may be kept as small as possible, the capacitance $C_{AB2}$ is dominated by (i.e., the value of $C_{AB2}$ may be small) the parasitic capacitances when transistors T3, T4, and T5 are off. Accordingly, there may be a significant difference in the capacitance seen at nodes 'A' and 'B' when transistors T3, T4, and T5 are turned on and when they are turned off.

As will be described in greater detail below, transistors T3, T4, and T5 may be selectively turned on and off by a control unit (shown in FIG. 5) during an initialization of oscillator 10, for example, to change the oscillation frequency. It is noted that within variable capacitance circuit 14, there may be many circuits similar to the circuit shown in FIG. 3, each independently controlled by a different control bit. Thus, a variety of capacitance values may be selected depending upon how many of these circuits are selected at any given time. Accordingly, by selecting one or more circuits, the oscillation frequency of oscillator 10 may be incrementally changed. The output frequency tuning range may be written as $$\Delta f_0 \propto \sqrt{\frac{C_{max}}{C_{min}}} \quad (5)$$

Similarly, the output frequency may be approximated as $$f_0 \cong \sqrt{\frac{1}{LC}} \quad (6)$$

It is noted that when transistors T3, T4, and T5 are turned off, nodes 'a' and 'b' may be floating. As such, the parasitic capacitances $C_{B1}$ and $C_{B2}$, which are associated with the source to drain diodes of transistors T3 and T4, are non-linear and thus subject to unpredictable capacitance influenced by the ill-defined voltages. As described further below, providing a biasing voltage at nodes 'a' and 'b' when transistors T3, T4, and T5 are turned off may allow $C_{B1}$ and $C_{B2}$ to maintain a predictable capacitance.

Figure 4:
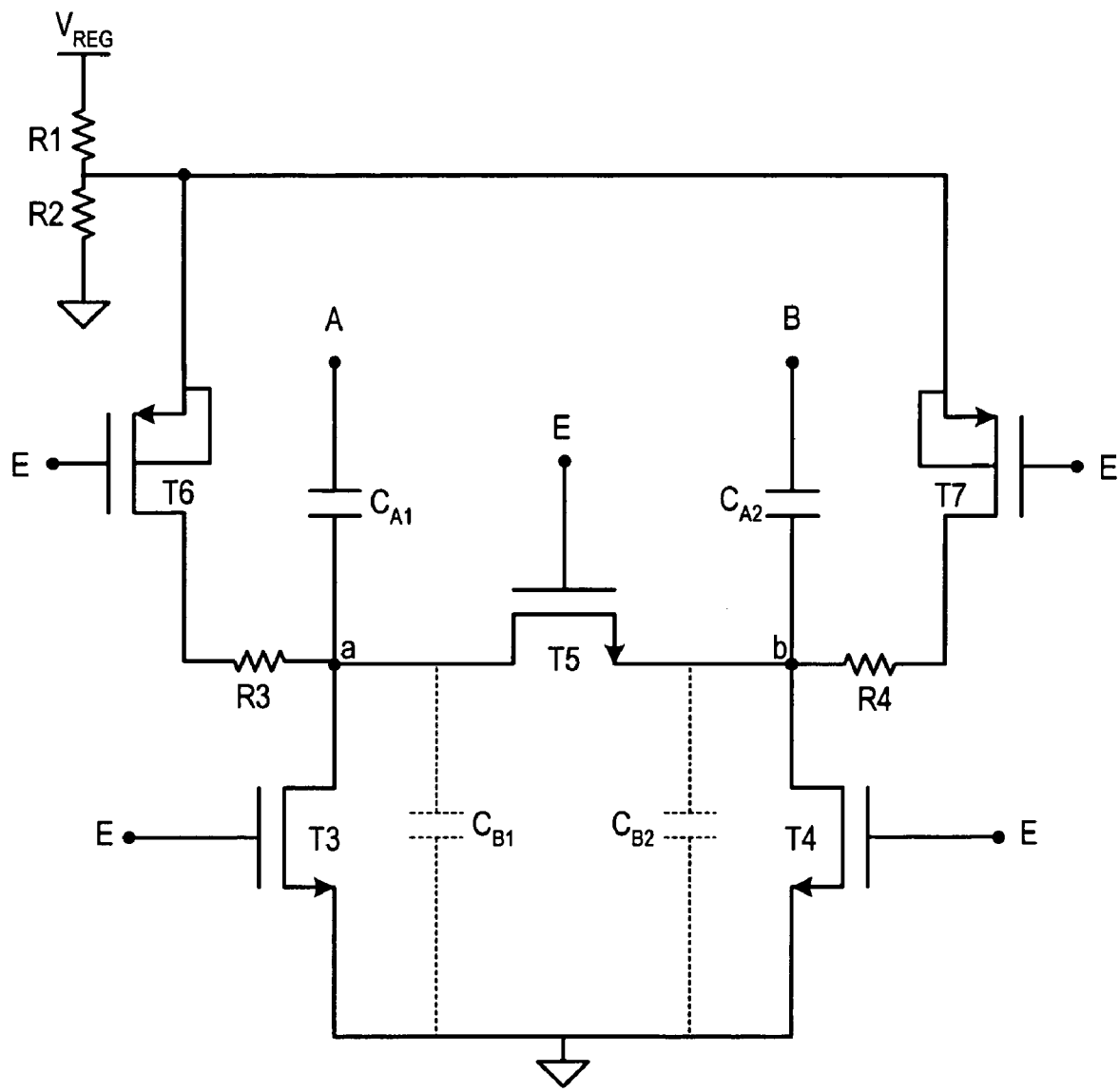
FIG. 4 is a schematic diagram of another embodiment of the variable capacitance circuit shown in FIG. 1 and FIG. 2.

Turning to FIG. 4, a schematic diagram of another embodiment of the variable capacitance circuit 14 of FIG. 1 and FIG. 2 is shown. Capacitance circuit 14 of FIG. 4 is similar to capacitance circuit 14 of FIG. 3. However, the capacitance circuit 14 of FIG. 4 includes a biasing circuit. The biasing circuit includes resistors R1 and R2, which form a voltage divider between $V_{REG}$ and circuit ground. The biasing circuit also includes switching transistor T6 in series with a resistor R3 coupled between the node between R1 and R2 and node 'a', and a switching transistor T7 in series with a resistor R4 coupled between the node between R1 and R2 and node 'b'.

It is noted that the bias voltage ($V_b$) provided by the voltage divider through R3 and R4 to nodes 'a' and 'b' may be selected such that the maximum and minimum voltages at nodes 'a' and 'b' may not overstress the transistors. More particularly, the minimum and maximum voltages at nodes 'a' and 'b' (when transistors T3, T4, and T5 are off) may be expressed as $$V_{min} = V_b - (V_{A\,max} - V_{REG})\frac{C_A}{C_A + C_B} \quad (7)$$

$$V_{max} = V_b + (V_{A\,max} - V_{REG})\frac{C_A}{C_A + C_B} \quad (8)$$

Accordingly, $V_b$ may be selected such that $V_{min}$ at nodes 'a' and 'b' may be greater than zero to avoid forward biasing the junction diodes, and $V_{max}$ at nodes 'a' and 'b' may be less than a safe voltage $V_{Safe}$ that will not overstress the transistors. Thus, one solution may be to select $V_b$ to be centered between 0V and $V_{Safe}$.

As shown, Transistors T6 and T7 are PMOS transistors each including a gate that is coupled to control bit 'E'. As describe above, when control bit 'E' is at a logic value of one, transistors T3, T4, and T5 may be conducting, while transistors T6 and T7 are not conducting. However, when control bit 'E' is at a logic value of zero, transistors T3, T4, and T5 may be off, while transistors T6 and T7 are on. In this case, nodes 'a' and 'b' may be "pulled up" to an average value of $V_b$.

As described above, amplifier 12 employs HV transistors. However, because the conductance of the HV transistors may be lower for a given parasitic capacitance, in capacitive circuit 14, it may be desirable to use LV transistors to reduce losses. Thus, since the biasing circuit prevents nodes 'a' and 'b' from going above $V_{Safe}$, transistors T3, T4, and T5 may be LV transistors.

It is noted that in other embodiments, $V_b$ may be provided using other methods. For example, the biasing circuit may include an additional voltage divider (not shown) including two resistors coupled between $V_{REG}$ and circuit ground. In such embodiments, the node between the two resistors may be coupled to the drain of transistor T7. Accordingly, the node between R1 and R2 may be disconnected from the drain of transistor T7.

Figure 5:
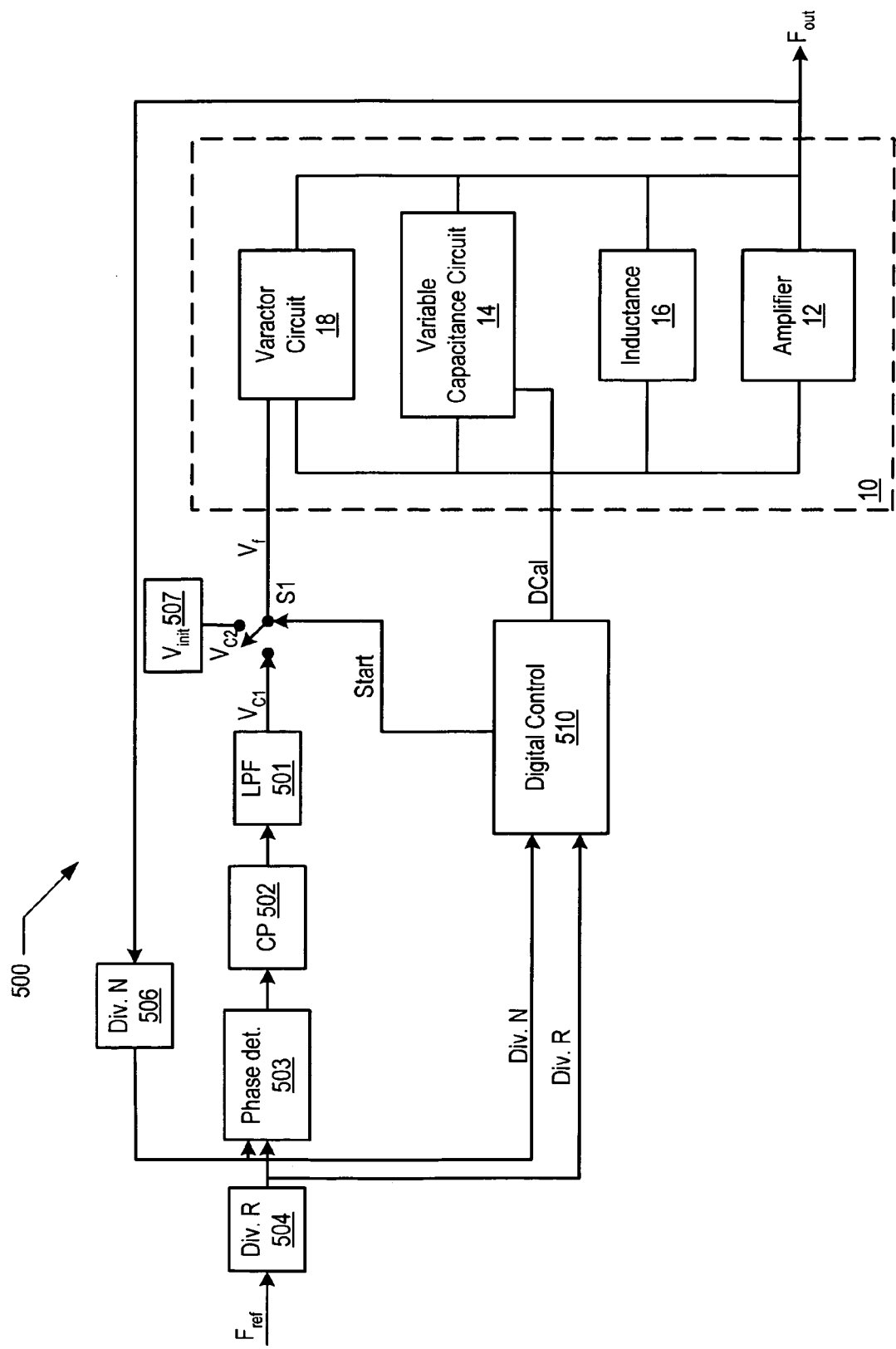
FIG. 5 is a block diagram of a frequency synthesizer including one embodiment of a controlled oscillator.

As described above, various wireless communication devices such as mobile telephones, for example may employ one or more frequency synthesizers to generate signals at different frequencies. FIG. 5 illustrates an exemplary frequency synthesizer including one embodiment of a controlled oscillator such as the oscillator of FIG. 1 and FIG. 2.

Referring to FIG. 5, frequency synthesizer 500 includes a frequency divider designated Div. R 504 that is coupled to a phased detector 503 and a digital control unit 510. Phase detector 503 is coupled to charge pump 502 that is coupled to a low pass filter LPF 501. Frequency synthesizer 500 also includes a frequency divider designated Div. N 506 that is coupled to phase detector 503. Frequency synthesizer 500 further includes an initialization unit 507 and a controlled oscillator 10, the output of which is coupled to frequency divider 506 in a feedback loop configuration. As described further below, oscillator 10 is coupled to one of low pass filter 501, initialization unit 507, and digital control unit 510 through switch S1 depending on the operating mode of frequency synthesizer 500.

Oscillator 10 is similar to oscillator 10 of FIG. 1 and FIG. 2, however, in the embodiment of FIG. 5, oscillator 10 includes a varactor circuit 18. In one embodiment, the varactor circuit 18 may include a voltage-controlled capacitance, which may provide a continuously variable capacitance value as the control voltage ($V_f$) varies. As shown, varactor circuit 18 is in parallel with variable capacitance circuit 14 and thus becomes part of the LC tank circuit which determines the oscillation frequency of oscillator 10. As such, during operation of frequency synthesizer 500, as the voltage $V_f$ changes, the output frequency ($F_{out}$) may change by a corresponding amount.

In addition, as mentioned above, variable capacitance circuit 14 may include one or more of the capacitor circuits illustrated in FIG. 4. Accordingly, in one embodiment, the DCal signal may be a discrete signal such as a digital value including one or more control bits. Each control bit may be associated with a respective capacitor circuit within variable capacitance circuit 14. As such, by providing a DCal value to variable capacitance circuit 14, the individual capacitor circuits may be selected and deselected. In one embodiment, the individual capacitor circuits may be connected in parallel, thus as described above, by selecting and deselecting given capacitor circuits, the capacitance value of variable capacitance circuit 14 may changed. For example, as each individual capacitor circuit is selected it may be add to the total capacitance of variable capacitance circuit 14.

During operation of frequency synthesizer 500, a signal including a reference frequency $F_{Ref}$ is received by divider 504 and the output frequency $F_{out}$ is received by divider 506. The resulting divided signals (e.g., Div. R and Div. N) are received by phase detector 506 and digital control unit 510 which outputs a digital control word (e.g., DCal) to oscillator 10. Phase detector 506 determines the phase difference between the phase of the Div. R signal and the phase of the Div. N signal. Phase detector 506 provides a voltage corresponding to the phase difference to drive charge pump 502. Charge pump 502 provides a voltage output that is filtered by a loop filter (e.g., LPF 501) to provide a first control voltage $V_{c1}$. The values for N and R may be selected to provide a desired output frequency such that $$F_{out} = N\left(\frac{F_{Ref}}{R}\right) \quad (9)$$

Initialization unit 507 may provide an initial control voltage $V_{C2}$. A switch (S1) allows for selection of which control voltage is the voltage node provided to varactor circuit 18.

When frequency synthesizer 500 initiates, output frequency $F_{out}$ may be controlled by digital control 510. The switch S1 selects the $V_{c2}$ as the control voltage for oscillator 10. As shown, $V_{c2}$ may be used as the control voltage for the continuously variable capacitance varactor circuit 18. In addition to providing a voltage input to varactor circuit 18, $V_{c2}$ may also charge the capacitors within the LPF 501 to an initial voltage value. Digital control 510 may include logic (not shown) that will determine through a desired procedure how to adjust the discretely variable capacitance by selecting one or more of the individual capacitor circuits within variable capacitance circuit 14 to coarsely tune the output frequency $F_{out}$. This determination may depend, for example, upon a comparison of the reference frequency $F_{Ref}$ to the output frequency $F_{out}$ or a comparison of the divided reference frequency Div. R to the divided output frequency Div. N. Depending upon the determination made, digital control 510 may adjust the digital control word DCal. As described above, the digital control word DCal may provide discrete control signals to the variable capacitance circuit 14.

Once the digital control 510 completes its coarse tuning procedure, digital control 510 may fix the digital control word DCal and then assert the START signal to change switch S1 so that it deselects control voltage $V_{C2}$ and instead selects $V_{C1}$ as the control voltage. Accordingly, the output frequency $F_{out}$ may be fine tuned by the continuously variable capacitance of varactor circuit 18 through operation of phase detector 503, charge pump 502 and the LPF 501. In one embodiment, digital control 510 may continue to monitor the output frequency $F_{out}$. If too great an error is detected, digital control 510 may cause switch (S1) to select $V_{C2}$ and again modify the digital control word DCal based upon a desired procedure to further tune oscillator 10.

In the illustrated embodiment, only one control loop, either digital or analog, may be tuning the output frequency $F_{out}$ at any given moment. However, it is noted that in other embodiments, both the digital and analog control loops may be concurrently active in tuning oscillator 10.

Figure 6:
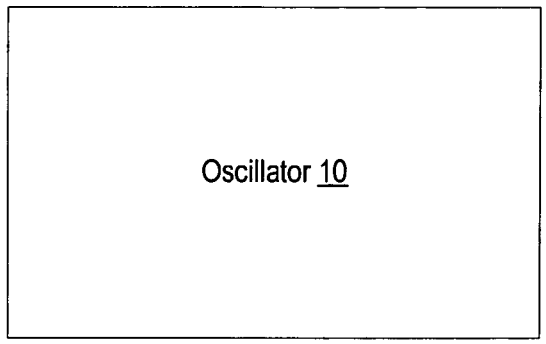
FIG. 6 is a diagram of one embodiment of computer readable medium including a data structure representative of the oscillator and its components shown in FIG. 1 through FIG. 5.

Turning next to FIG. 6, a block diagram of a computer readable medium 600 including a data structure representative of one embodiment of oscillator 10 is shown. Generally speaking, a computer readable medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the data structure of oscillator 10 carried on computer readable medium 600 may be a data structure which may be read by a program and used, directly or indirectly, to fabricate the hardware comprising oscillator 10. For example, the data structure may be a behavioral-level description or register-transfer level (RTL) description of the hardware functionality in a high level design language (HDL) such as Verilog or VHDL. The description may be read by a synthesis tool that may synthesize the description to produce a netlist comprising a list of gates in a synthesis library. The netlist comprises a set of gates that may represent the functionality of the hardware comprising oscillator 10. The netlist may then be placed and routed to produce a data set describing geometric shapes to be applied to masks. The masks may then be used in various semiconductor fabrication steps to produce a semiconductor circuit or circuits corresponding to oscillator 10. Alternatively, the data structure on carrier medium 600 may be the netlist (with or without the synthesis library) or the data set, as desired.

While computer readable medium 600 carries a representation of oscillator 10, other embodiments may carry a representation of any portion of oscillator 10, as desired, including one or more variable capacitance circuits 14, amplifier 12 and/or other components illustrated in FIG. 1 through FIG. 5, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An oscillator circuit comprising:
   an amplifier including a first switching transistor coupled between a first node and a reference node and a second switching transistor coupled between a second node and the reference node, and wherein an output of the first switching transistor is coupled to a gate terminal of the second switching transistor and an output of the second switching transistor is coupled to a gate terminal of the first switching transistor; and
   one or more variable capacitance circuits coupled between the first node and the second node, wherein each variable capacitance circuit comprises:
   a first capacitor coupled between the first node and a third node;
   a second capacitor coupled between the second node and a fourth node;
   a third, a fourth and a fifth switching transistor interconnected to selectively couple the first and second capacitors to the reference node;
   wherein the third, fourth and fifth switching transistors are low voltage transistors;
   wherein the first and the second switching transistors are high voltage transistors.

2. The oscillator circuit as recited in claim 1, wherein a frequency of oscillation of a signal generated at the first and second nodes is dependent upon a capacitance value of the one or more variable capacitance circuits.

3. The oscillator circuit as recited in claim 2, wherein the capacitance value of the one or more variable capacitance circuits is selected via a discrete signal applied to a gate terminal of each of the third, fourth and fifth switching transistors.

4. The oscillator circuit as recited in claim 3, wherein each of the one or more variable capacitance circuits further includes a bias circuit coupled to the third node and to the fourth node.

5. The oscillator circuit as recited in claim 4, wherein the bias circuit is configured to provide a bias voltage to the third node and fourth node when the third, fourth, and fifth switching transistors are in a non-conductive state.

6. The oscillator circuit as recited in claim 5, wherein the bias circuit includes a sixth switching transistor and a seventh switching transistor, each having a gate terminal that is coupled to the discrete signal.

7. The oscillator circuit as recited in claim 5, wherein the bias voltage is a fraction of a regulated voltage supplied to the oscillator circuit.

8. The oscillator circuit as recited in claim 1, further comprising a voltage-controlled varactor circuit, wherein a frequency of oscillation of a signal generated at the first and second nodes is dependent upon a control voltage applied to the voltage-controlled varactor circuit, wherein the voltage-controlled varactor circuit is configured to finely tune the frequency of oscillation.

9. The oscillator circuit as recited in claim 1, wherein the fifth switching transistor is sized larger than the third switching transistor and the fourth switching transistor such that an effective gate width of the fifth switching transistor is wider than a gate width of the third switching transistor and the fourth switching transistor.

10. The oscillator circuit as recited in claim 1, wherein a gate oxide of each of the first and the second switching transistors is thicker than a gate oxide of each of the third, fourth, and fifth switching transistors.

11. The oscillator circuit as recited in claim 1, further comprising an inductance coupled between the first node and the second node, wherein the inductance includes a first inductor coupled in series with a second inductor.

12. The oscillator circuit as recited in claim 11, wherein a regulated voltage is supplied to the oscillator circuit at a node between the first and second inductors.

13. The oscillator circuit as recited in claim 1, wherein the third switching transistor is coupled between the third node and the reference node, the fourth switching transistor is coupled between the fourth node and the reference node, and the fifth switching transistor coupled between the third node and the fourth node.

14. The oscillator circuit as recited in claim 1, wherein the gate of the fifth switching transistor has a larger width than the gate of each of the third and the fourth switching transistors.

15. The oscillator circuit as recited in claim 1, wherein the first, second, third, fourth, and fifth switching transistors are manufactured on a same semiconductor integrated circuit.

16. A method comprising:
   providing an amplifier including a first switching transistor coupled between a first node and a reference node and a second switching transistor coupled between a second node and the reference node, and wherein an output of the first switching transistor is coupled to a gate terminal of the second switching transistor and an output of the second switching transistor is coupled to a gate terminal of the first switching transistor; and
   providing one or more variable capacitance circuits and connecting the one or more variable capacitance circuits between the first node and the second node, wherein each variable capacitance circuit comprises:
   a first capacitor coupled between the first node and a third node;
   a second capacitor coupled between the second node and a fourth node;

a third, a fourth and a fifth switching transistor interconnected to selectively couple the first and second capacitors to the reference node;

wherein the third, fourth and fifth switching transistors are low voltage transistors;

wherein the first and the second switching transistors are high voltage transistors.

17. The method as recited in claim 16, further comprising generating a signal at the first and second nodes having a frequency of oscillation that is dependent upon a capacitance value of the one or more variable capacitance circuits.

18. The method as recited in claim 17, further comprising selecting the capacitance value of the one or more variable capacitance circuits using a discrete signal applied to a gate terminal of each of the third, fourth and fifth switching transistors.

19. The method as recited in claim 18, further comprising providing a bias circuit coupled to the third node and to the fourth node of each of the one or more variable capacitance circuits.

20. The method as recited in claim 19, wherein the bias circuit is configured to provide a bias voltage to the third node and fourth node when the third, fourth, and fifth switching transistors are in a non-conductive state.

21. The method as recited in claim 20, wherein the bias circuit includes a sixth switching transistor and a seventh switching transistor, each having a gate terminal that is coupled to the discrete signal.

22. The method as recited in claim 16, wherein the fifth switching transistor is sized larger than the third switching transistor and the fourth switching transistor such that an effective gate width of the fifth switching transistor is wider than a gate width of the third switching transistor and the fourth switching transistor.

23. The method as recited in claim 16, wherein a gate oxide of each of the first and the second switching transistors is thicker than a gate oxide of each of the third, fourth, and fifth switching transistors.

24. The method as recited in claim 16, wherein the gate of the fifth switching transistor has a larger width than the gate of each of the third and the fourth switching transistors.

25. The method as recited in claim 16, wherein the first, second, third, fourth, and fifth switching transistors are manufactured on a same semiconductor integrated circuit.

26. A computer readable medium comprising a data structure which is operated upon by a program executable on a computer system, the program operating on the data structure to perform a portion of a process to fabricate an integrated circuit including circuitry described by the data structure, the circuitry described in the data structure including an oscillator comprising:

an amplifier including a first switching transistor coupled between a first node and a reference node and a second switching transistor coupled between a second node and the reference node, and wherein an output of the first switching transistor is coupled to a gate terminal of the second switching transistor and an output of the second switching transistor is coupled to a gate terminal of the first switching transistor; and one or more variable capacitance circuits coupled between the first node and the second node, wherein each variable capacitance circuit comprises:

a first capacitor coupled between the first node and a third node;

a second capacitor coupled between the second node and a fourth node;

a third, a fourth and a fifth switching transistor interconnected to selectively couple the first and second capacitors to the reference node;

wherein the third, fourth and fifth switching transistors are low voltage transistors;

wherein the first and the second switching transistors are high voltage transistors.

27. The computer readable medium as recited in claim 26, wherein a frequency of oscillation of a signal generated at the first and second nodes is dependent upon a capacitance value of the one or more variable capacitance circuits.

28. The computer readable medium as recited in claim 27, wherein the capacitance value of the one or more variable capacitance circuits is selected via a discrete signal applied to a gate terminal of each of the third, fourth and fifth switching transistors.

* * * * *